United States Patent [19]

Bahl

[11] Patent Number: 5,748,056

[45] Date of Patent: May 5, 1998

[54] COMPACT 90° MONOLITHIC GAAS COUPLER FOR WIRELESS APPLICATIONS

[75] Inventor: Inder J. Bahl, Roanoke, Va.

[73] Assignee: ITT Industries, Inc., White Plains, N.Y.

[21] Appl. No.: 720,674

[22] Filed: Oct. 2, 1996

[51] Int. Cl.$^6$ .................................................. H01P 5/16
[52] U.S. Cl. ............................................ 333/112; 333/116
[58] Field of Search ...................................... 333/112, 116, 333/118, 246

[56] References Cited

U.S. PATENT DOCUMENTS 3,593,208  7/1971  Smith ........................................ 333/112
4,777,458  10/1988  Pardini ...................................... 333/112
5,382,925  1/1995  Hayashi ..................................... 333/112

*Primary Examiner*—Paul Gensler
*Attorney, Agent, or Firm*—Plevy & Associates

[57] ABSTRACT

A coupler device is disclosed which has an improved structure. The structure includes a substrate and, input ports and output ports disposed over the substrate. A plurality of inductors and capacitors are further included, which are arranged in a predetermined configuration and coupled between the ports. A layer of dielectric material is also disposed between the inductors and substrate which improves performance by reducing the dissipation losses and enhancing the frequency response of the coupler.

18 Claims, 3 Drawing Sheets

COMPACT 90° MONOLITHIC GAAS COUPLER FOR WIRELESS APPLICATIONS

RELATED APPLICATIONS

The Assignee herein, ITT Corporation, is the record owner of co-pending U.S. application to Bahl, entitled LOW LOSS RIDGED MICROSTRIP LINE FOR MONOLITHIC MICROWAVE INTEGRATED CIRCUIT (MMIC) APPLICATIONS, Ser. No. 08/693,868, filed Aug. 5, 1996.

BACKGROUND OF THE INVENTION

1. Field of the Invention

The present invention relates generally to coupler devices, and more particularly to a 90° coupler utilizing lumped elements which is compatible with GaAs monolithic processing and further includes an additional dielectric layer to increase performance of the device.

2. Description of the Prior Art

Couplers generally are passive devices which are utilized in various microwave circuit applications. Such applications include being utilized as power level monitor, a local oscillator injection device, an attenuator, a power combiner/divider or a device to provide a fixed relative phase angle between two signals.

A coupler is a lossless, reciprocal, four-port circuit consisting of two pairs of ports in which the ports of each pair are mutually isolated from one another, and one of the pairs are matched. These conditions imply that the other pair of ports is also matched. Such devices operate on the principle of constructive and destructive interference of two waves. A signal at the input splits into two waves that are transmitted to the isolated port 180° out of phase and thus cancel each other out. At the direct and coupled output ports, the two waves are transmitted in phase with each other and thus interfere constructively.

A 90°/hybrid coupler is a more specific type of coupler device. What distinguishes this type of coupler is that the two waves are transmitted at the output ports having equal magnitudes, but have a relative phase difference of 90°. Thus, the two waves at the output ports only partially interfere with each other.

In wireless microwave applications, 90°0 couplers are required in order to determine the phase error of a transmitter utilizing the QPSK Modulation Scheme. This application is important since the QPSK Modulation Scheme is widely utilized in today's digital cellular radio systems. The basic requirements for couplers in wireless applications include small size, low cost, tight amplitude balance and quadrature phase between the output ports.

There are basically two approaches to realize 90° couplers at low microwave frequencies, which is the frequency range of interest in wireless applications. These approaches include using distributed elements or lumped elements. It has been determined that at the low end of microwave frequencies, passive circuits utilizing lumped elements are more suitable than distributed elements. This is because the lumped approach better utilizes all of the available area on a GaAs substrate, which makes it more compatible with conventional GaAs monolithic processing. Further, the distributed approach for 90° couplers utilizing either MIC or MMIC technology, results in a larger size and, poor performance in terms of isolation capability and amplitude balance at the output ports.

A current trend in MMIC technology is to reduce the dissipation loss of 90° couplers. One reason for this trend is that there is an increasing demand to reduce the dissipation loss in order to improve the noise figure in low noise amplifiers and the power added efficiency performance in power amplifiers.

It is therefore, an object of the present invention to provide a 90° coupler utilizing lumped elements with an improved structure for reducing the dissipation loss and enhancing its frequency response, which is also compatible with conventional GaAs monolithic processing.

SUMMARY OF THE INVENTION

A coupler device is disclosed which has an improved structure. The structure includes a substrate and, input ports and output ports disposed over the substrate. A plurality of inductors and capacitors are further included, which are arranged in a predetermined configuration and coupled between the ports. A layer of dielectric material is also disposed between the inductors and substrate which improves performance by reducing the dissipation losses and enhancing the frequency response of the coupler.

It is further disclosed that the predetermined configuration of the inductors and capacitors is either a one section network or a two section network.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to a compact 90° monolithic coupler utilizing lumped elements which enables the device to be compatible with GaAs monolithic processing. The present invention further includes an additional dielectric material disposed between the substrate and inductor elements in order to provide a coupler with improved performance.

Figure 1:
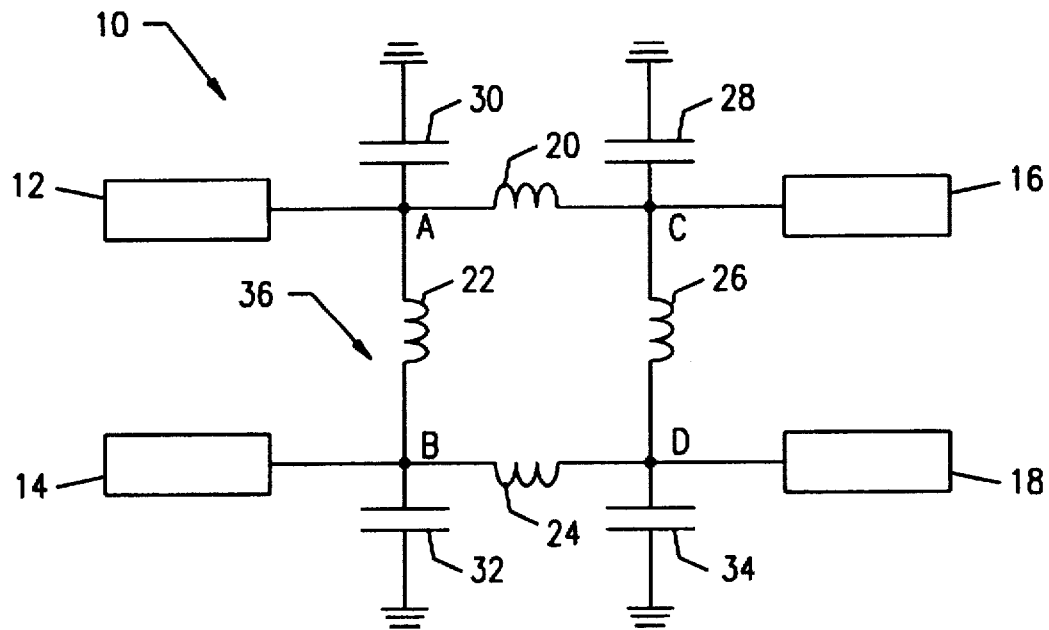
FIG. 1 is a schematic representation of the first embodiment of the 90° coupler according to the present invention.

Referring to FIG. 1, there is shown a schematic representation of the first embodiment of the 90° coupler according to the present invention. The first embodiment 10 is what is known as a one-section 90° coupler device. This particular coupler has a plurality of lumped elements or components configured in a one section network. The coupler 10 includes a pair of input ports 12,14 and a pair of output ports 16,18 as shown. As in all 90° couplers, the signal transmitted to the output ports 16,18 have equal magnitudes, but have a relative phase angle of 90°.

Coupled between the input ports 12,14 and output ports 16,18 is the one section network 36 of lumped elements, which induces the 90° phase difference at the output ports 16,18. The one section network 36 in reality is a resonant circuit having a Q factor and resonant frequency, where the Q factor is the ratio of the resonant frequency to the bandwidth of the circuit.

The one section network 36 includes four circuit nodes A,B,C,D, wherein each of the node A,B,C,D are associated with one of the ports 12,14,16,18. Coupled between every two of the circuit nodes A,B,C,D are respective inductors 20,22,24,26. Coupled between the nodes A,B,C,D and ground are respective capacitors 28,30,32,34.

The first embodiment of the coupler 10 is preferably configured to operate at a frequency of 900 MHz. The frequency range for this device 10 is also preferably 900±45 MHz with an amplitude balance of ±0.2 dB and a phase difference of 90°±2°. The above described frequency characteristics are achieved by the proper selection of lumped element values that are included in the one section network 36. The preferred selection includes inductors 20,24 having a value of about 6.7 nH, inductors 22,26 having a value of about 9.5 nH and capacitors 28,30,32,34 having a value of about 8 pF.

Figure 2:
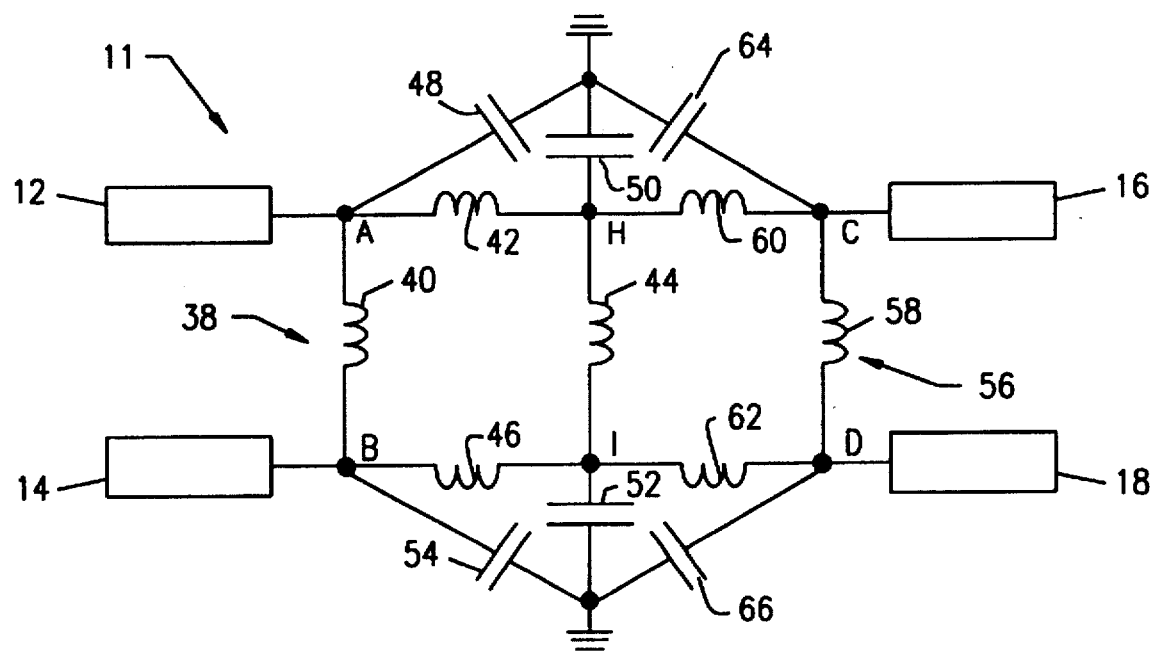
FIG. 2 is a schematic representation of the second embodiment of the 90° coupler according to the present invention.

Referring to FIG. 2, a schematic representation of the second embodiment of the 90° coupler according to the present invention is shown. The second embodiment 11 is what is known as a two-section 90° coupler device. This particular coupler has a two section network 38,56 of lumped elements coupled between the input ports 12,14 and output ports 16,18. The two section network 38,56 also induces the 90° phase difference at the output ports 16,18, but enables the second embodiment 11 to operate at a wider bandwidth. The two section network 38,56 is also a resonant circuit having a Q factor and resonant frequency.

The two section network 38,56 includes a first section 38 and a second section 56, which are coupled together by two common circuit nodes H,I. Both sections 38,56 have the same circuit configuration as the one section network previously described in regard to the first embodiment. The elements included in the first section 38 include inductors 40,42,44,46 and capacitors 48,50,52,54. Elements included in the second section 56 include inductors 44,58,60,62 and capacitors 50,52,64,66. As can be seen capacitors 50,52 and inductor 44 is common to both sections 38,56.

The second embodiment of the coupler 11 is also preferably configured to operate at a frequency of 900 MHz. However, the frequency range for this device 10 is preferably wider at 900±100 MHz with an amplitude balance of ±0.2 dB and a phase difference of 90°±2°. The above described frequency characteristics are achieved by the proper selection of lumped element values that are included in the two section network 38,56. The preferred selection includes inductors 42,44,46,60,62 having a value of about 5.4 nH, inductors 40,58 having a value of about 19.3 nH, capacitors 48,54,64,66 having a value of 7.2 pF and capacitors 50,52 having a value of about 16.9 pF.

Figure 3:
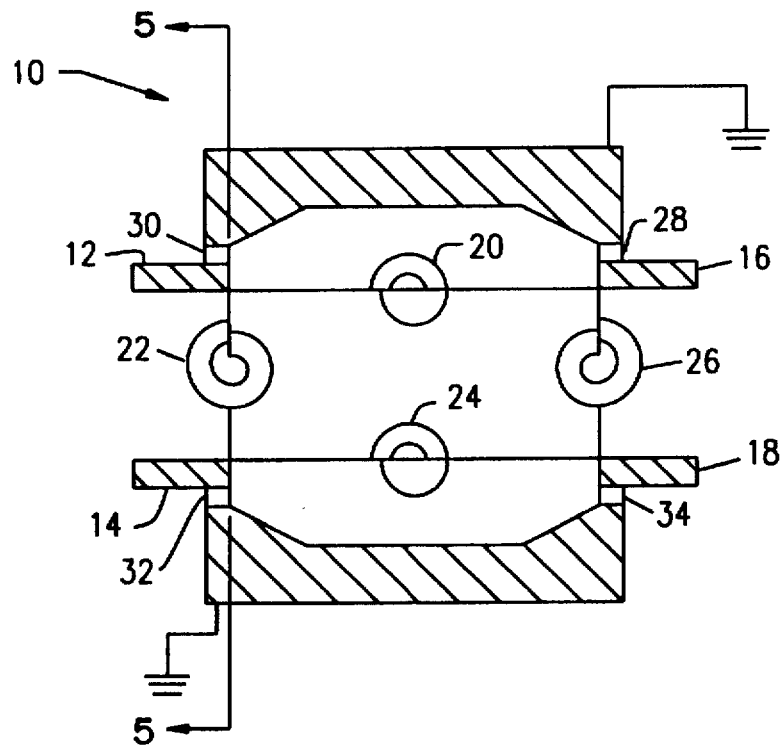
FIG. 3 is a top view of the physical layout for the first embodiment of the 90° coupler according to the present invention.

Referring to FIG. 3, there is shown a top view of the physical layout for the first embodiment of the 90° coupler according to the present invention. This layout of the coupler 10 is preferably implemented using the ITT MSAG GaAs process, which is described in U.S. Pat. No. 4,832,761 to Geissberger et al., entitled PROCESS FOR MANUFACTURING GALLIUM ARSENIDE MONOLITHIC MICROWAVE INTEGRATED CIRCUITS USING NON-PHOTOSENSITIVE ACID RESIST FOR HANDLING, issued May 23, 1989 and U.S. Pat. No. 4,847,212 to Balzan et al., entitled SELF ALIGNED GATE FET PROCESS USING UNDERCUT ETCH MASK, issued Jul. 11, 1989.

In the present invention, the coupler 10 is fabricated by disposing layers of material over a substrate (not shown) which form the inductors 20,22,24,26 capacitors 28,30,32, 34 and ports 12,14,16,18. Disposed beneath the inductors 20,22,24,26 is an additional dielectric layer (not shown) which is preferably a layer of polyimide material, while the capacitors 28,30,32,34, ports 12,14,16,18 and via pads (if via hole technology is utilized) is fabricated directly to the substrate.

Figure 4:
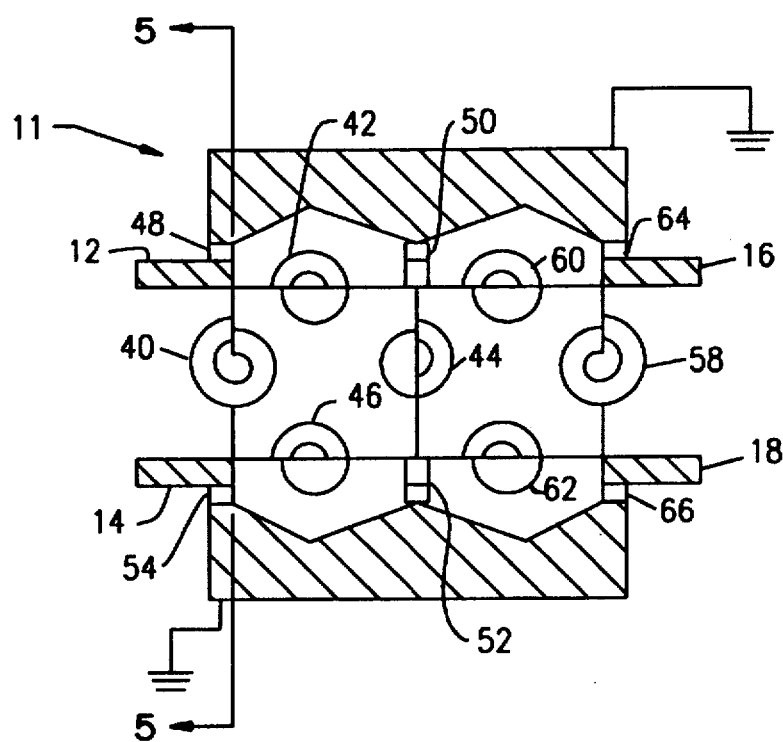
FIG. 4 is a top view of the physical layout for the second embodiment of the 90° coupler according to the present invention.

Referring to FIG. 4, a top view of the physical layout for the second embodiment of the 90° coupler according to the present invention is shown. This layout of the coupler 11 is also implemented by using the ITT MSAG GaAs process. This embodiment 11 is also fabricated by disposing layers of material over a substrate (not shown) which form the inductors 40,42,44,46,58,60,62, capacitors 48,50,52,54,64, 66 and ports 12,14,16,18. In this embodiment, the inductors 40,42,44,46,58,60,62 are also disposed over an additional dielectric layer (not shown) which is preferably polyimide material, while the capacitors 48,50,52,54,64,66, ports 12,14,16,18 and via pads (if via hole technology is utilized) are fabricated directly to the substrate. As a result of configuring the coupler 11 as described above, the chip area is obtained in the order of 2 mm².

Figure 5:
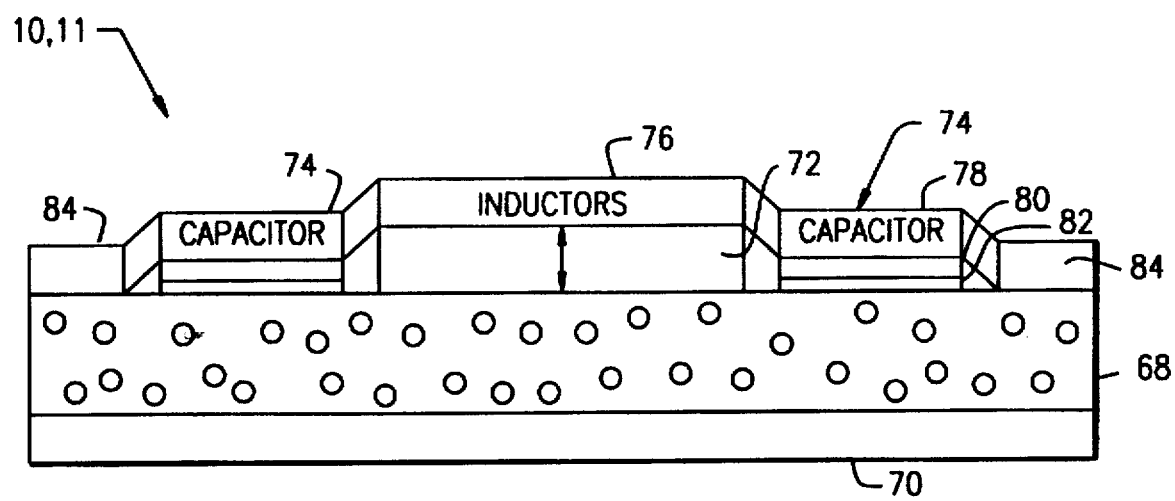
FIG. 5 is a representative cross sectional view for both embodiments of the 90° coupler according to the present invention.

Referring to FIG. 5, there is shown a representative cross sectional view for both embodiments of the 90° coupler according to the present invention. This view represents the cross section of both embodiments along the EE axis as shown in FIGS. 3 & 4. As can be seen, both embodiments 10,11 include a substrate 68 having a lower surface coated with metallized material to form a ground plane 70. The inductors 76, capacitors 74 and ports 84 are disposed over the substrate 68 as shown. The inductors 76 are implemented by a single layer of metallized material, while the capacitors 74 include two metallized layers 78,82 and a dielectric 80, which is preferably $Si_3N_4$.

Disposed between the substrate 68 and inductors 76 is the additional dielectric layer 72, which is utilized in the present invention in order to improve performance of the couplers 10,11. One benefit of utilizing the additional dielectric layer 72 is that the couplers 10,11 frequency response is enhanced. This is because the additional dielectric layer 72 increases the Q factor and raises the resonant frequency of both couplers 10,11. As previously discussed, both the Q factor and resonant frequency determine the bandwidth of such devices. Another benefit of utilizing the additional dielectric layer 72 is that the dissipation loss of the couplers 10,11 is substantially reduced. This is accomplished when the dielectric layer 72 has a permittivity less than that of the material utilized as the substrate 68.

The permittivity is defined as the property which describes the electric flux density produced when the material is excited by an electrical potential. Absolute permittivity is the ratio of the electric flux density produced by an electric field. Relative permittivity is the ratio of electric flux density produced in a material to the value in free space produced by the same electric field strength. Relative permittivity is also known as the dielectric constant of a material. Therefore, in order for the dielectric layer 72 to reduce the dissipation loss of the couplers 10,11, it must have a dielectric constant which is less than that of the substrate 68.

In the present invention, the dielectric layer 72 may be any material which has a dielectric constant less than that of the substrate material. However, polyimide material is preferred, which is a material utilized in various other electronic packaging applications. Thin films of this material can be spin cast or sprayed for use as IC passivation layers, while thicker films are used for flexible laminates. Polyimides exhibit desirable mechanical and electrical properties as well as high temperature properties.

Most commonly, polyimide films are cast as polyamic acid solutions which are thermally dehydrated to form the final polymer. Proper curing is necessary in order to obtain the best mechanical and electrical properties. The cured polymers are generally insoluble intractable materials, but such materials are not crosslinked. This distinction is important since polyimides with a modified chemical structure can be soluble.

In the present invention, the dielectric layer 72 is preferably a thin layer of polyimide material having a thickness T in the range of 5 to 10 um. Preferably the substrate 68 should also be fabricated from GaAs material, which is the preferred material for microwave applications. The dielectric constants of the GaAs substrate 68 and the polyimide dielectric layer 72 preferably are 12.9 and 3.0, respectively.

While the invention has been particularly shown and described with reference to preferred embodiments thereof, it will be understood by those skilled in the art that changes in form and details may be made therein without departing from the spirit and scope of the present invention.

What is claimed is:

1. A lumped element coupler device for wireless microwave applications of the type including input ports and output ports disposed over a semiconductive substrate, a plurality of inductors and capacitors arranged in a predetermined configuration and coupled between said ports, wherein the improvement therewith comprising:

a layer of dielectric material disposed between said inductors and said substrate for improving the performance of said coupler device by reducing the dissipation losses and enhancing the frequency response, wherein said dielectric layer has a dielectric constant which is less than the dielectric constant of said substrate.

2. The device of claim 1, wherein said dielectric layer has a dielectric constant of 3.0 and said substrate has a dielectric constant of 12.9.

3. The device of claim 1, wherein said dielectric layer is a layer of polyimide material.

4. The device of claim 2, wherein said polyimide layer has a thickness in the range of 5 to 10 um.

5. The device of claim 1, wherein said substrate is a Gallium Arsenide (GaAs) material.

6. The device of claim 1, wherein said predetermined configuration is a one section network configured to induce a 90° phase shift at said output ports, said one section network including four circuit nodes, an inductor coupled between every two of said nodes and a capacitor further coupled to each said node.

7. The device of claim 1, wherein said predetermined configuration is a two section network configured to induce a 90° phase shift at said output ports, said two section network includes a first section and a second section, wherein each of said sections include four circuit nodes, an inductor coupled between every two of said nodes and a capacitor further coupled to each said node.

8. The device of claim 7, wherein said sections are coupled together in such a fashion in order to provide two nodes, two capacitors and an inductor that are common two both said sections.

9. A lumped element coupler device for wireless microwave applications, comprising:

a semiconductive substrate;

input ports and output ports disposed over said substrate;

a plurality of inductors and capacitors arranged in a predetermined configuration and coupled between said ports; and a layer of dielectric material disposed between said inductors and said substrate for improving the performance of said coupler device by reducing the dissipation losses and enhancing the frequency response, wherein said dielectric layer has a dielectric constant which is less than the dielectric constant of said substrate.

10. The device of claim 9, wherein said dielectric layer has a dielectric constant of 3.0 and said substrate has a dielectric constant of 12.9.

11. The device of claim 9, wherein said dielectric layer is a layer of polyimide material.

12. The device of claim 11, wherein said polyimide layer has a thickness in the range of 5 to 10 um.

13. The device of claim 9, wherein said substrate is a Gallium Arsenide (GaAs) material.

14. The device of claim 9, wherein said predetermined configuration is a one section network including four circuit nodes, an inductor coupled between every two of said nodes and a capacitor further coupled to each said node.

15. The device of claim 9, wherein said predetermined configuration is a two section network including a first section and a second section, wherein each of said sections include four circuit nodes, an inductor coupled between every two of said nodes and a capacitor further coupled to each said node.

16. The device of claim 15, wherein said sections are coupled together in such a fashion in order to provide two nodes, two capacitors and an inductor that are common two both said sections.

17. The device of claim 9, wherein said predetermined configuration is configured to induce a 90° phase shift at said output ports.

18. A method for fabricating a lumped element coupler device, comprising the steps of:

providing a semiconductive substrate;

disposing input ports and output ports over said substrate;

coupling between said ports a plurality of inductors and capacitors arranged in a predetermined configuration; and disposing a layer of dielectric material between said inductors and said substrate for improving the performance of said coupler device by reducing the dissipation losses and enhancing the frequency responses wherein said dielectric layer has a dielectric constant which is less than the dielectric constant of said substrate.

* * * * *